(12) United States Patent
Lewis, II

(10) Patent No.: US 8,257,155 B2
(45) Date of Patent: Sep. 4, 2012

(54) SELECTIVELY ROUTING AIR WITHIN AN ELECTRONIC EQUIPMENT ENCLOSURE

(75) Inventor: Richard Evans Lewis, II, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 1350 days.

(21) Appl. No.: 11/625,729

(22) Filed: Jan. 22, 2007

(65) Prior Publication Data

US 2007/0173189 A1 Jul. 26, 2007

Related U.S. Application Data

(60) Provisional application No. 60/743,148, filed on Jan. 20, 2006.

(51) Int. Cl.
*H05K 5/00* (2006.01)

(52) U.S. Cl. .......................... 454/184; 361/690

(58) Field of Classification Search ............... 454/184, 454/185, 186; 361/690, 691, 695, 692, 694, 361/696; 62/259.2

See application file for complete search history.

(56) References Cited

U.S. PATENT DOCUMENTS

| | | | |
|---|---|---|---|
| 3,192,306 A | 6/1965 | Skonnard | |
| 3,298,195 A | 1/1967 | Raskhodoff | |
| 3,364,838 A | 1/1968 | Bradley | |
| 4,467,584 A | 8/1984 | Crites et al. | |
| 4,495,545 A | 1/1985 | Dufresne et al. | |
| 4,541,219 A | 9/1985 | Parker | |
| 4,592,602 A | 6/1986 | Kuster et al. | |
| 4,648,007 A | 3/1987 | Garner | |
| 4,774,631 A | 9/1988 | Okuyama et al. | |
| 5,216,579 A | 6/1993 | Basara et al. | |
| 5,528,454 A | 6/1996 | Niklos | |
| 5,544,012 A | 8/1996 | Koike | |
| 5,570,740 A | 11/1996 | Flores et al. | |
| 5,639,150 A | 6/1997 | Anderson et al. | |
| 5,671,805 A | 9/1997 | Stahl et al. | |
| 5,695,263 A | 12/1997 | Simon et al. | |

(Continued)

FOREIGN PATENT DOCUMENTS

DE 2509487 A 9/1976

(Continued)

OTHER PUBLICATIONS

Rasmussen, Neil, "Air Distribution Architecture Options for Mission Critical Facilities", White Paper #55, 2003, pp. 1-13, Revision 1, American Power Conversion (APC), West Kingston, Rhode Island.

(Continued)

*Primary Examiner* — Steven B McAllister
*Assistant Examiner* — Brittany E Towns
(74) *Attorney, Agent, or Firm* — Tillman Wright, PLLC; James D. Wright; Chad D. Tillman

(57) ABSTRACT

A method of cooling electronic equipment mounted in an enclosure includes routing air from beneath the enclosure to an upper portion of the enclosure, selectively routing air to electronic equipment mounted in the upper portion of the enclosure, and exhausting heated air from the electronic equipment to an enclosure outlet. In addition, preventing recirculation includes installing and arranging an internal air duct within an enclosure in such a manner that recirculation is prevented, and balancing air temperature around an enclosure includes using an internal air duct.

6 Claims, 14 Drawing Sheets

U.S. PATENT DOCUMENTS

| | | | |
|---|---|---|---|
| 5,718,628 A * | 2/1998 | Nakazato et al. | 454/184 |
| 5,791,498 A | 8/1998 | Mills | |
| 5,806,945 A | 9/1998 | Anderson et al. | |
| 5,851,143 A | 12/1998 | Hamid | |
| 5,941,767 A | 8/1999 | Fukuda | |
| 5,997,117 A | 12/1999 | Krietzman | |
| 6,034,873 A | 3/2000 | Stahl et al. | |
| 6,036,290 A | 3/2000 | Jancsek et al. | |
| 6,044,193 A | 3/2000 | Szentesi et al. | |
| 6,104,003 A * | 8/2000 | Jones | 219/400 |
| D432,098 S | 10/2000 | Nelson et al. | |
| 6,127,663 A * | 10/2000 | Jones | 219/553 |
| 6,163,454 A | 12/2000 | Strickler | |
| 6,198,628 B1 | 3/2001 | Smith | |
| 6,222,729 B1 | 4/2001 | Yoshikawa | |
| 6,381,147 B1 | 4/2002 | Hayward et al. | |
| 6,459,579 B1 | 10/2002 | Farmer et al. | |
| 6,462,944 B1 | 10/2002 | Lin | |
| 6,554,697 B1 | 4/2003 | Koplin | |
| 6,557,357 B2 | 5/2003 | Spinazzola et al. | |
| 6,574,970 B2 | 6/2003 | Spinazzola et al. | |
| 6,601,932 B1 | 8/2003 | Helgenberg et al. | |
| 6,611,428 B1 | 8/2003 | Wong | |
| 6,616,524 B2 | 9/2003 | Storck, Jr. et al. | |
| 6,646,878 B2 | 11/2003 | Chan | |
| 6,652,373 B2 | 11/2003 | Sharp et al. | |
| 6,668,565 B1 * | 12/2003 | Johnson et al. | 62/89 |
| 6,704,196 B1 | 3/2004 | Rodriguez et al. | |
| 6,710,240 B1 | 3/2004 | Chen et al. | |
| 6,745,579 B2 | 6/2004 | Spinazzola et al. | |
| 6,788,535 B2 | 9/2004 | Dodgen et al. | |
| 6,819,563 B1 | 11/2004 | Chu et al. | |
| 6,854,284 B2 | 2/2005 | Bash et al. | |
| 6,867,967 B2 | 3/2005 | Mok | |
| 6,912,131 B2 | 6/2005 | Kabat | |
| 7,011,576 B2 | 3/2006 | Sharp et al. | |
| 7,016,194 B1 | 3/2006 | Wong | |
| 7,033,267 B2 | 4/2006 | Rasmussen | |
| 7,074,123 B2 | 7/2006 | Bettridge et al. | |
| 7,112,131 B2 | 9/2006 | Rasmussen et al. | |
| 7,144,320 B2 | 12/2006 | Turek et al. | |
| 7,154,748 B2 | 12/2006 | Yamada | |
| 7,182,208 B2 | 2/2007 | Tachibana | |
| 7,212,403 B2 | 5/2007 | Rockenfeller | |
| 7,236,362 B2 | 6/2007 | Wang et al. | |
| 7,255,640 B2 | 8/2007 | Aldag et al. | |
| 7,259,961 B2 | 8/2007 | Lucero et al. | |
| 7,259,963 B2 * | 8/2007 | Germagian et al. | 361/695 |
| 7,286,345 B2 | 10/2007 | Casebolt | |
| 7,309,279 B2 | 12/2007 | Sharp et al. | |
| 7,349,209 B2 | 3/2008 | Campbell et al. | |
| 7,355,850 B2 | 4/2008 | Baldwin | |
| 7,372,695 B2 | 5/2008 | Coglitore | |
| 7,425,678 B2 | 9/2008 | Adducci et al. | |
| 7,427,713 B2 | 9/2008 | Adducci et al. | |
| 7,438,124 B2 | 10/2008 | Bhatti et al. | |
| 7,485,803 B2 | 2/2009 | Adducci et al. | |
| 7,486,512 B2 | 2/2009 | Campbell et al. | |
| 7,495,169 B2 | 2/2009 | Adducci et al. | |
| 7,500,911 B2 | 3/2009 | Johnson et al. | |
| 7,504,581 B2 | 3/2009 | Adducci et al. | |
| 7,508,663 B2 | 3/2009 | Coglitore et al. | |
| 7,604,535 B2 | 10/2009 | Germagian et al. | |
| 7,643,291 B2 | 1/2010 | Mallia et al. | |
| 7,751,188 B1 | 7/2010 | French et al. | |
| 7,752,858 B2 | 7/2010 | Johnson et al. | |
| 7,764,495 B2 | 7/2010 | Hruby et al. | |
| 7,804,685 B2 | 9/2010 | Krietzman | |
| 7,894,190 B2 | 2/2011 | Davis et al. | |
| 7,895,855 B2 | 3/2011 | Gooch | |
| 7,952,869 B2 | 5/2011 | Lewis, II et al. | |
| 7,957,139 B2 | 6/2011 | Davis et al. | |
| 2002/0101721 A1 | 8/2002 | Blood | |
| 2002/0153649 A1 * | 10/2002 | Weber et al. | 267/217 |
| 2004/0007348 A1 | 1/2004 | Stoller | |
| 2004/0050808 A1 | 3/2004 | Krampotich et al. | |
| 2004/0099747 A1 | 5/2004 | Johnson et al. | |
| 2004/0182799 A1 | 9/2004 | Tachibana | |
| 2004/0190270 A1 | 9/2004 | Aldag et al. | |
| 2004/0201335 A1 | 10/2004 | Davis | |
| 2005/0029910 A1 | 2/2005 | Woods | |
| 2005/0153649 A1 | 7/2005 | Bettridge et al. | |
| 2005/0165586 A1 * | 7/2005 | Moore | 702/188 |
| 2005/0168945 A1 | 8/2005 | Coglitore | |
| 2005/0170770 A1 | 8/2005 | Johnson et al. | |
| 2005/0225936 A1 | 10/2005 | Day | |
| 2005/0237716 A1 | 10/2005 | Chu et al. | |
| 2006/0141921 A1 | 6/2006 | Turek et al. | |
| 2006/0276121 A1 | 12/2006 | Rasmussen | |
| 2006/0285291 A1 | 12/2006 | Elkins | |
| 2007/0064389 A1 | 3/2007 | Lewis, II | |
| 2008/0007911 A1 | 1/2008 | Hallin et al. | |
| 2008/0068791 A1 | 3/2008 | Ebermann | |
| 2008/0266789 A1 | 10/2008 | Hruby et al. | |
| 2009/0061755 A1 | 3/2009 | Calder et al. | |
| 2009/0190307 A1 | 7/2009 | Krietzman | |
| 2009/0227197 A1 | 9/2009 | Lewis, II et al. | |
| 2009/0239460 A1 | 9/2009 | Lucia et al. | |
| 2009/0239461 A1 | 9/2009 | Lewis, II et al. | |
| 2010/0061059 A1 | 3/2010 | Krietzman et al. | |
| 2010/0172092 A1 | 7/2010 | Davis et al. | |
| 2010/0172093 A1 | 7/2010 | Davis et al. | |
| 2011/0287704 A1 | 11/2011 | Lewis, II et al. | |
| 2011/0290553 A1 | 12/2011 | Behrens et al. | |
| 2012/0013229 A1 | 1/2012 | Krietzman | |

FOREIGN PATENT DOCUMENTS

| | | |
|---|---|---|
| EP | 2205054 A1 | 7/2010 |
| GB | 2354066 A | 3/2001 |
| JP | 02000286580 | 10/2000 |
| JP | 2004-2000594 | 7/2004 |
| JP | 2004-252758 | 9/2004 |
| WO | 2009103090 A2 | 8/2009 |
| WO | 2009103090 A3 | 10/2009 |
| WO | 2010028384 A2 | 3/2010 |

OTHER PUBLICATIONS

Information Disclosure Statement (IDS) Letter Regarding Common Patent Application(s), dated Jan. 7, 2010.

Chatsworth Products, Inc., Brochure "Thermal Management Solutions", Rev. 3/08, 6 pages.

Information Disclosure Statement (IDS) Letter Regarding Common Patent Application(s), submitted by Applicant on Sep. 22, 2009.

"International Search Report" and "Written Opinion" of the International Search Authority (Korean Intellectual Property Office) in Chatsworth Products, Inc. et al., International Patent Application Serial No. PCT/US2009/034338, filed on Feb. 17, 2009 mailed on Sep. 1, 2009 and completed on Aug. 31, 2009, 7 pages.

Information Disclosure Statement (IDS) Letter Regarding Common Patent Application(s), dated Nov. 3, 2009.

Information Disclosure Statement (IDS) Letter Regarding Common Patent Application(s) dated Apr. 6, 2010.

"International Searching Report" and "Written Opinion of the International Searching Authority" (ISA/US Korean Intellectual Propery Office) in Chatsworth Products, Inc. et al., International Patent Application Serial No. PCT/US2009/056256, Applicant's file reference 3001.214, International Filing Date Sep. 8, 2009, Mailed on Apr. 7, 2010, Completed on Apr. 6, 2010, 7 pages.

Information Disclosure Statement (IDS) Letter Regarding Common Patent Application(s), dated Aug. 23, 2010.

Information Disclosure Statement (IDS) Letter Regarding Common Patent Application(s), dated Sep. 1, 2010.

Information Disclosure Statement (IDS) Letter Regarding Common Patent Application(s), dated May 10, 2011.

HP 10000 G2 42U Rack Air Duct Installation Guide, Hewlett-Packard Development Company, LP, dated Aug. 2008, 23 pages.

Information Disclosure Statement (IDS) Letter Regarding Common Patent Application(s), dated Sep. 21, 2011.

Information Disclosure Statement (IDS) Letter Regarding Common Patent Application(s), dated Jul. 22, 2011.

\* cited by examiner

SELECTIVELY ROUTING AIR WITHIN AN ELECTRONIC EQUIPMENT ENCLOSURE

CROSS-REFERENCE TO RELATED APPLICATION

The present application is a U.S. nonprovisional patent application of, and claims priority under 35 U.S.C. §119(e) to, U.S. Provisional Patent Application No. 60/743,148, filed Jan. 20, 2006, which provisional patent application is incorporated by reference herein.

COPYRIGHT STATEMENT

All of the material in this patent document is subject to copyright protection under the copyright laws of the United States and of other countries. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE PRESENT INVENTION

1. Field of the Present Invention

The present invention relates generally to racks and cabinets for supporting computer and other electronic equipment, and, in particular, to air ducts for providing cool air to hot spots in equipment enclosures.

2. Background

Racks, frames, cabinets and the like for supporting computer and other electronic equipment are very well known. Such support apparatus are often partially or fully enclosed, either directly through the use of doors and panels mounted directly thereon, or indirectly by lining several such apparatuses up in a row such that the sides of each rack is immediately adjacent another rack.

As is also well known, the electronic equipment mounted therein tends to generate large amounts of heat that need to be exhausted away from the equipment effectively in order to maintain the equipment in proper operating order or to prevent damage thereto. As equipment becomes more densely packed with electronics, the quantities of heat have continued to increase in recent years, and heat management has become a significant issue confronting today's rack, cabinet, frame and enclosure manufacturers, the manufacturers of the electronic equipment, and the users of such equipment.

A common type of operating environment for racks, frames, cabinets, and the like (hereinafter generally referred to as enclosures) and the equipment mounted therein is known as a "raised floor" system, wherein the enclosures are supported on a heavy-duty mechanical floor that is installed above the actual floor of the room at a given elevation. One significant advantage of this approach is that cables, wires, water pipes, and other utility connections may be routed to and from the enclosures via the space beneath the floor, thereby leaving the top surface of the raised floor clear for locating enclosures and traversal by users. Another significant advantage, however, is that the space beneath the top surface of the raised floor serves as a plenum through which cool air may likewise be distributed to the enclosures. Through open tiles or perforations or ventilations in the tiles comprising the surface of the raised floor, this cool air may be supplied to the enclosures and used to cool the equipment inside.

The supply of cool air to the raised floor plenum, and the disposal of heated air from the electronic equipment, is conventionally handled by the Computer Room Air Conditioner ("CRAC"). Airflow through the plenum and into the enclosures generally relies solely or at least primarily on the air pressure differential as measured between the raised floor plenum and the ambient room. However, active means are often used to push or pull heated air out of the enclosures.

Unfortunately, the use of perforated floor tiles, typically located directly in front of enclosures to try to cause a maximum amount of cool air to be directed into the enclosures and not merely lost to the ambient room, have been found to be insufficient in cooling the equipment within the enclosures to the desired degree. Thus, a number of techniques and devices have been developed in recent years to more efficiently utilize the capabilities of the CRAC and to put the available cool air to the most efficient use possible. Among others, these include the development of the hot aisle/cold aisle strategy that is now well known to those of ordinary skill in the art, as well as improved strategies involving perforated panels, such as those described in the commonly-assigned U.S. patent application Ser. No. 11/548,158, filed Oct. 10, 2006 and entitled "RATIO OF OPEN AREA TO CLOSED AREA IN PANELS FOR ELECTRONIC EQUIPMENT ENCLOSURES," and also improved external ducting strategies, such as those described in the commonly-assigned U.S. patent application Ser. No. 11/533,362, filed Sep. 19, 2006, and entitled "AIR DIVERTER FOR DIRECTING AIR UPWARDLY IN AN EQUIPMENT ENCLOSURE," the entirety of each of which is incorporated herein by reference.

However, little effort has been made to this point in developing ducting strategies for the space inside the enclosures. This is believed to have generally gone undeveloped because of the relative lack of space available inside the enclosures for such efforts. Nonetheless, given today's emphasis on improved efficiency in every aspect of the cooling system, a need exists for such a solution.

One exemplary internal ducting strategy, shown in U.S. Pat. No. 6,745,579, utilizes a cavity-type front door with a solid external panel and a perforated internal panel that creates a cooling air duct at the front of an enclosure. Air flows through a portion of a bottom of the enclosure and then through the duct of the cavity-type door. A drawback of this internal ducting structure is that it is difficult to retrofit an existing enclosure with such structure because the enclosure itself must be altered in order to use it. More particularly, the enclosure must be retrofitted with the cavity-type front door, which may not fit within an existing enclosure, and the bottom of the enclosure must be altered so that air is able to flow into the enclosure and through the duct created between the panels of the front door.

In addition, although the cavity-type door of the '579 patent may provide even flow of cool air to the front of an enclosure, it does not provide a means for selectively providing cooling air to portions of the enclosure. Such selective cooling of equipment stored within the enclosure is desirable. Further, because the cavity-type front door has a solid external panel, air from perforated floor panels in front of the enclosure is unable to enter the enclosure. As such, a significant amount of cooling air is blocked.

In addition, in cooling electronic equipment within an enclosure, a common problem that arises is recirculation of hot exhaust air. As used herein, recirculation may be defined as the condition when hot exhaust air, exiting from the rear of the equipment chassis, travels back into the intake (cold) air stream of the equipment chassis. This recirculating hot exhaust air increases the temperature of the intake air which causes the equipment to run at a higher operating temperature. Accordingly, a device that hinders or prevents recirculation within an enclosure is desirable.

SUMMARY OF THE PRESENT INVENTION

Briefly, in accordance with one or more embodiments of the invention, a vertical internal air duct is used within an enclosure to route cold air from beneath a raised floor to electronic equipment mounted within the enclosure. The duct has several openings or ports that direct a low pressure cold air stream toward the front of the enclosure, where the air intakes for the various pieces of equipment are typically located. Ports may be closed off with a variety of doors, filler plates, knockout panels, adjustable grilles, and the like, so that cold air may be directed as necessary to specific equipment mounted within the enclosure.

Typical datacenter cooling strategies rely on perforated floor tiles placed directly in front of the enclosure. Particularly in densely populated enclosures with high flow requirements, the air flow through the mounted equipment (typically, computer servers) may exceed the flow capacity of the floor tile. In such applications, the equipment mounted in the lower portion of the enclosure will have air which is considerably colder than the air available at the upper equipment mounting positions. The air duct of the present invention may be used in these situations to route cold air above the lower equipment and directly to the intake region of the upper Rack Mount Unit ("RMU") locations. Because the intake for the air duct is located beneath the enclosure and additional air flow is routed along the sides of the equipment, the net flow capacity to an enclosure may be increased by using the duct in conjunction with a perforated tile located in front of the enclosure.

The duct is passive, generally relying on the air pressure differential generated by the Computer Room Air Conditioner ("CRAC") as measured between the raised floor plenum and the ambient room. The system imposes no requirements for redundancy in power, fans or filters. The burden of redundancy is at the CRAC unit itself.

Broadly defined, in one aspect of the present invention, an internal air duct for an electronic equipment enclosure comprises a collector, adapted to receive cool air, and at least one riser, having an interior in fluid communication with an interior of the collector. The collector and riser are adapted to be mounted within an electronic equipment enclosure and the riser has a port for routing the cool air received from the collector to an interior of the enclosure.

In a feature of this aspect, the collector includes a rectangular, hollow body, open to the bottom, wherein the collector is adapted to be in fluid communication with a corresponding opening in a floor tile and with the interior of the riser, such that cool air flows from the floor through the collector to the riser. In an additional feature, the internal air duct is installed within the electronic equipment enclosure.

In another feature, the riser is adapted to extend from a lower portion of the enclosure to an upper portion of the enclosure such that the port is disposed in the upper portion of the enclosure. With regard to this feature, the internal air duct further includes a port door that may be opened or closed to permit air to flow through the port. It is preferred that the port door is repositionable to redirect air, flowing through the port, in a desired direction. It is further preferred that the port door is hingedly connected to the riser. In accordance with the above feature, the internal air duct further includes an air dam disposed in the path of air flowing through the port and adapted to redirect the air in a different direction. With regard to the air dam, the air dam is a scoop, is mounted vertically on the riser, and is adapted to be mounted to the enclosure in a vertical orientation.

With further regard to the above feature, the internal air duct further includes a plurality of ports adjustable between a closed state and an open state. With regard to the plurality of ports, at least one port includes a knockout panel, at least one port includes an adjustable grille assembly, and at least one port includes a removable filler plate. In accordance with this feature, the port is oriented toward the front of the enclosure. In further accordance with this feature, each of the at least one riser is adapted to be mounted within the enclosure laterally adjacent electronic equipment mounted therein so as to fit between a side of the electronic equipment and a side of the enclosure.

In a second aspect of the invention, an electronic equipment enclosure installation comprises an electronic equipment enclosure, electronic equipment mounted therein, and an internal air duct mounted laterally adjacent a side of the electronic equipment so as to fit in a space between the side of the electronic equipment and a side of the enclosure.

In a feature of this aspect, the internal air duct is dimensioned to occupy the entire space between the side of the electronic equipment and the side of the enclosure to prevent recirculation of air around the side of the electronic equipment. In another feature of this aspect, the electronic equipment enclosure installation includes a second internal air duct mounted laterally adjacent a side of the electronic equipment opposite the side where the first internal air duct is disposed such that the second internal air duct fits in a space between the second side of the electronic equipment and a second side of the enclosure. With regard to this feature, the second internal air duct is dimensioned to occupy the entire space between the second side of the electronic equipment and the second side of the enclosure to prevent recirculation of air around the second side of the electronic equipment.

In a third aspect of the invention, an electronic equipment enclosure installation comprises an electronic equipment enclosure, a collector adapted to receive cool air, and at least one riser, wherein the riser has an interior in fluid communication with an interior of the collector, is adapted to be mounted within the electronic equipment enclosure and has a port for routing the cool air received from the collector to an interior of the enclosure.

In a feature of this aspect, the collector and riser are separate structures from those defining the electronic equipment enclosure. In another feature, the riser extends from a lower portion of the enclosure to an upper portion of the enclosure such that the port is disposed in the upper portion of the enclosure. With regard to this feature, the electronic equipment enclosure installation further includes a port door, mounted on the riser, that may be opened or closed to permit air to flow through the port. It is preferred that the port door is repositionable to redirect air, flowing through the port, in a desired direction. It is further preferred that the port door is hingedly connected to the riser.

In accordance with the above feature, the electronic equipment enclosure installation further includes an air dam disposed in the path of air flowing through the port and adapted to redirect the air in a different direction. With regard to the air dam, the air dam is a scoop, is mounted vertically on the riser, and is adapted to be mounted to the enclosure in a vertical orientation.

In further accordance with the above feature, the electronic equipment enclosure installation further includes a plurality of ports, disposed in the riser, that are adjustable between a closed state and an open state. With regard to the ports, at least one port includes a knockout panel, at least one port includes an adjustable grille assembly, and at least one port includes a removable filler plate. It is preferred that the port is oriented toward the front of the enclosure. It is further preferred that each of the at least one riser is adapted to be mounted within the enclosure laterally adjacent electronic equipment mounted therein so as to fit between a side of the electronic equipment and a side of the enclosure.

In a fourth aspect of the invention, a method of cooling electronic equipment mounted in an enclosure comprises routing air from beneath the enclosure to an upper portion of the enclosure; selectively routing air to electronic equipment mounted in the upper portion of the enclosure; and exhausting heated air from the electronic equipment to an enclosure outlet.

In a feature of this aspect, routing air from beneath the enclosure to an upper portion of the enclosure includes routing air from beneath the enclosure through a collector and into a riser and further routing through the riser to a port disposed therein and arranged in the upper portion of the enclosure, and wherein routing air to the electronic equipment includes routing air from the port to the electronic equipment. In accordance with this feature, the method further comprises configuring the collector such that an interior thereof is in fluid communication with an interior of the riser, such that air may flow freely from the beneath the enclosure through the collector to the riser.

In a fifth aspect of the invention, a method of preventing recirculation around electronic equipment disposed in an electronic equipment enclosure comprises installing and arranging at least one riser within the enclosure in such a manner that recirculation is prevented.

In a feature of this aspect, arranging comprises disposing the at least one riser between a side of the electronic equipment and a side of the enclosure in order to prevent recirculation. With regard to this feature, dimensioning the at least one riser to occupy the entire space between the side of the electronic equipment and the side of the enclosure in order to prevent recirculation.

In a sixth aspect of the invention, a method of cooling electronic equipment mounted in an enclosure comprises routing air from beneath an enclosure to an interior of the enclosure; measuring air temperature at a plurality of locations downstream from electronic equipment mounted in the interior of the enclosure; balancing the air temperature at the plurality of locations downstream from the electronic equipment by selectively routing air, via an internal air duct, to the electronic equipment; and exhausting heated air from the electronic equipment to an enclosure outlet.

In features of this aspect, air temperature is measured within the enclosure, at an outlet to the enclosure, and outside the enclosure. In another feature, balancing the air temperature includes selectively adjusting ports of the internal air duct. In an additional feature, the method further adjusting the temperature of cool air provided by a CRAC based on air temperatures measured downstream from electronic equipment mounted in the interior of the enclosure.

Further areas of applicability of the present invention will become apparent from the detailed description provided hereinafter. It should be understood that the detailed description and specific examples, while indicating the preferred embodiments of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION OF THE PREFERRED EMBODIMENTS

Figure 1:
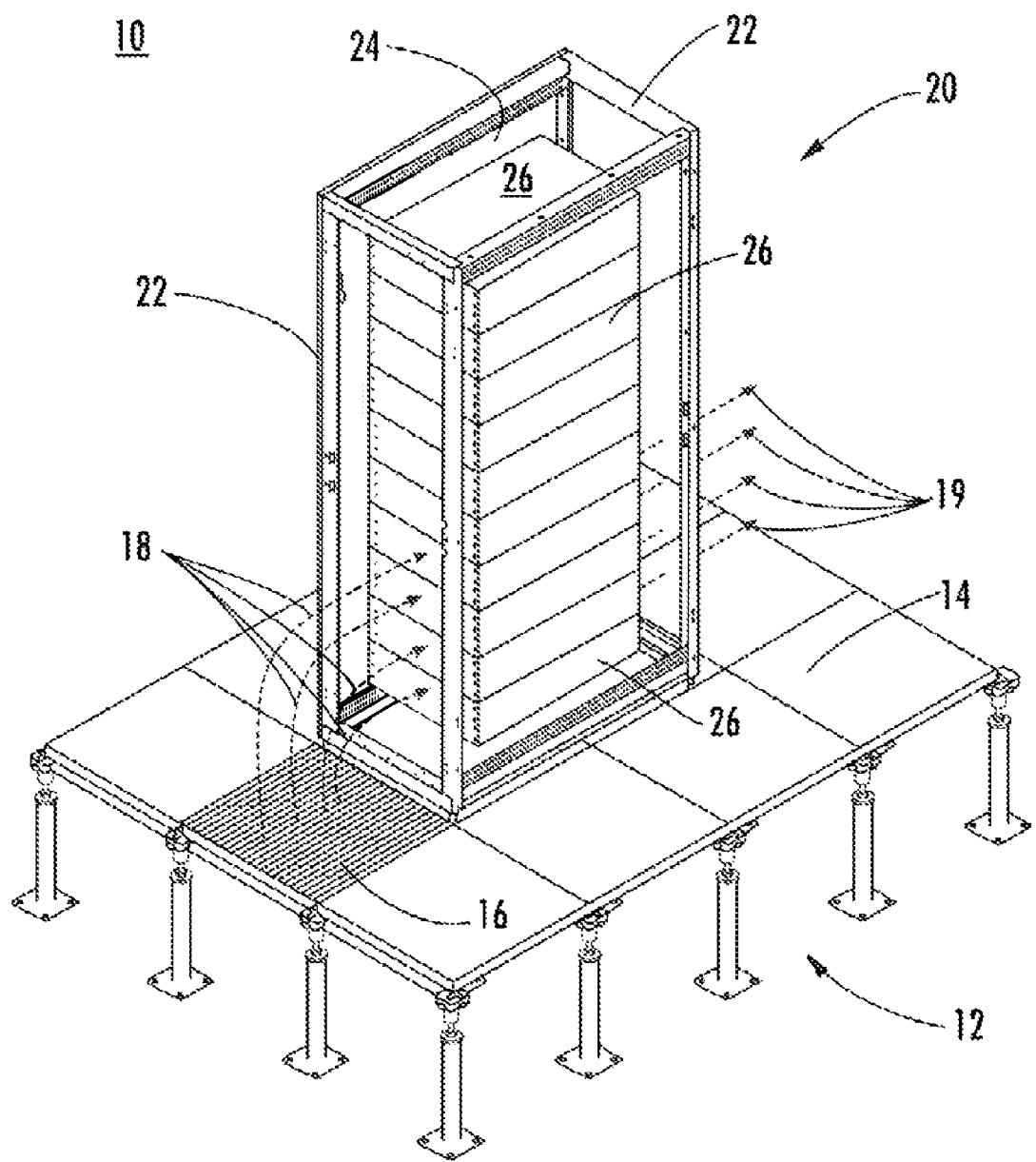
FIG. 1 is an isometric view of a prior art electronic equipment enclosure installation.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers", "a picnic basket having crackers without cheese", and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of the preferred embodiment(s) is merely exemplary in nature and is in no way intended to limit the invention, its application, or uses.

FIG. 1 is an isometric view of a prior art electronic equipment enclosure installation 10. As shown therein, the electronic equipment enclosure installation typically includes an equipment enclosure 20 supported by a raised floor 12. The equipment enclosure 20 comprises a frame 22, conventionally formed from vertical and horizontal frame members, and may further include mounting rails, for supporting electronic equipment 26 and related accessories, and one or more panels 24, which conventionally take the form of side panels, front and rear doors or panels, top panels, and bottom panels. One side panel 24 is visible in FIG. 1, but it will be appreciated that all other panels (i.e., the opposite side panel, the top and bottom panels, and the front and rear panels) have been removed for clarity.

The raised floor 12 includes a plurality of floor panels or tiles 14, 16 of standard size and conventional design, all supported above the permanent floor at a desired height. The floor tiles 14, 16 include solid tiles 14 as well as perforated or ventilated tiles 16, the latter of which are designed to permit cool air supplied from the space beneath the floor 12, commonly referred to as the raised floor plenum, to flow therethrough. In particular, a ventilated tile 16 is conventionally located directly in front of each equipment enclosure 20 to provide the most direct path to the interior of the enclosure and the air intakes for the equipment 26 located inside. (For clarity, it will be understood that in the drawings, the side of the equipment enclosure 20 immediately adjacent the ventilated tile 16 is referred to as the front of the enclosure 20, the side opposite is the rear, and that the enclosure 20 further has a top, a bottom and two sides, each having its ordinary meaning relative to the front and rear sides of the enclosure.) Further, although not specifically illustrated herein, the area directly underneath such an equipment enclosure is often left fully or partially open by eliminating one or more tiles, by using tiles with large openings therein, or by using tiles that are less than full-size.

In use, electronic equipment 26 is installed in the equipment enclosure 20, typically by attaching the equipment 26 to the mounting rails, and operated normally. As described previously, the equipment 26 generates considerable heat while it operates. Conventionally, the heat is forced or forcibly drawn out of the rear of the various active pieces of equipment 26 by internal fans (not shown), often supplemented by separate fans (not shown) mounted in or on the enclosure 20. Much of the heat is then exhausted through one or more outlets in the rear of the enclosure 20 as represented by arrows 19, but heated air is often also guided up through outlets in the top of the enclosure 20. Once outside the enclosure, the heat is handled by the CRAC, sometimes in combination with additional ducts, fans, partitions, and/or other equipment (not shown).

At the same time, cool air, represented by arrows 18, flows up through the perforated tiles 16 and in through the front of the enclosure 20, thereby facilitating the flow of air through the enclosure 20 and cooling the equipment 26 mounted therein. Although not shown, cool air is often also guided through the openings directly beneath the enclosure 20. Unfortunately, as illustrated in FIG. 1, this airflow 18 frequently reaches only the lower elevations of the interior of the enclosure 20, and thus only effectively cools the equipment 26 mounted at lower elevations.

Figure 2:
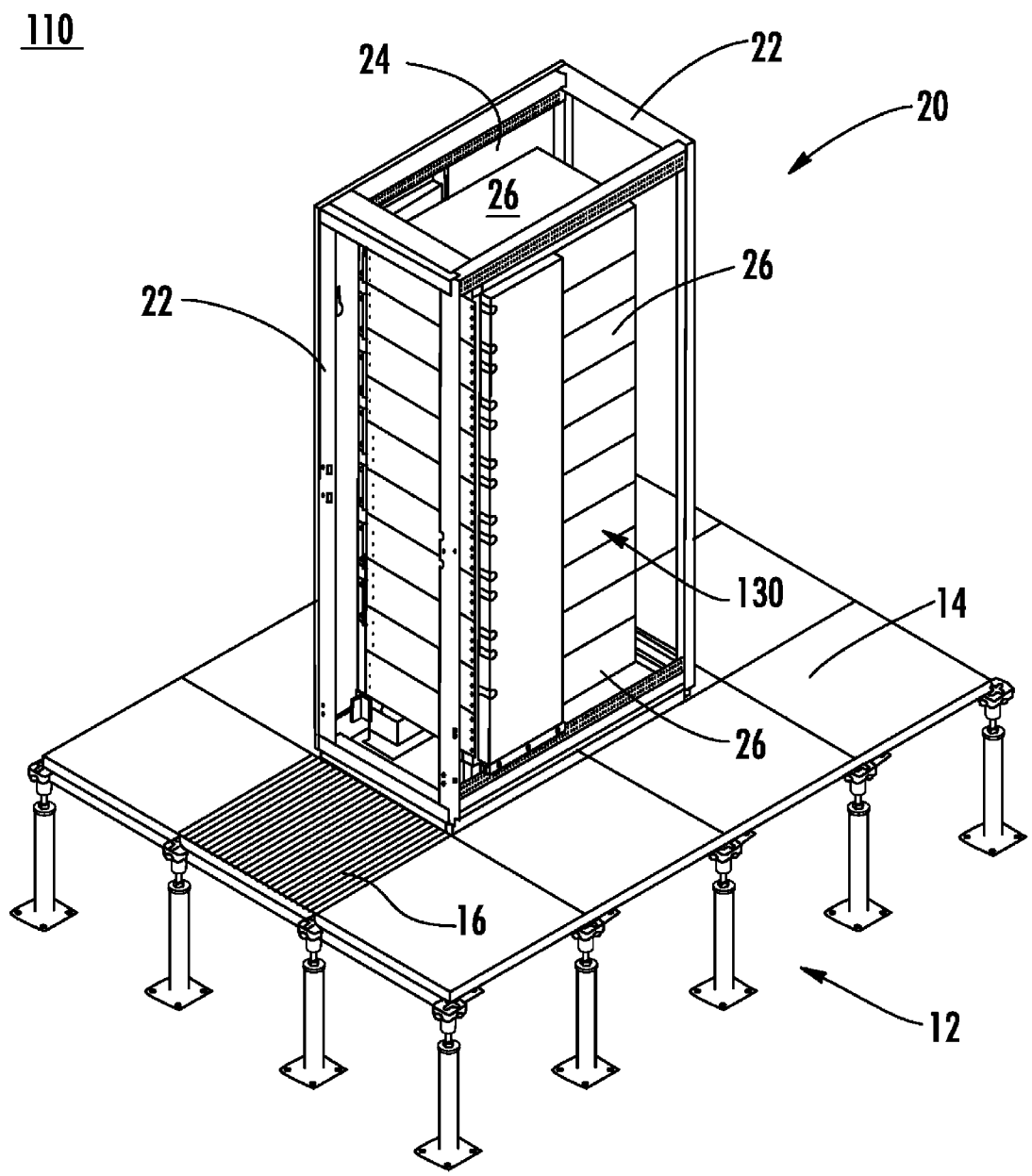
FIG. 2 is an isometric view of an electronic equipment enclosure installation, having an internal air duct, in accordance with a preferred embodiment of the present invention.

FIG. 2 is an isometric view of an electronic equipment enclosure installation 110, having an internal air duct 130, in accordance with a preferred embodiment of the present invention. Like the installation 10 of FIG. 1, this installation 110 includes an equipment enclosure 20 supported by a raised floor 12, each of which is of generally similar construction to that described previously. Arranged inside the equipment enclosure 20, however, is an internal air duct 130 adapted to guide the flow of cool air from beneath the floor tiles 14, 16 to various elevations within the enclosure 20. The elements of this internal air duct 130 and its operation are fully described hereinbelow. As with FIG. 1, it will be appreciated that only a single panel 24 (the left side panel) is present in the installation of FIG. 2, as all other panels (i.e., the opposite side panel, the top and bottom panels, and the front and rear panels) have been removed for clarity.

Figure 3A:
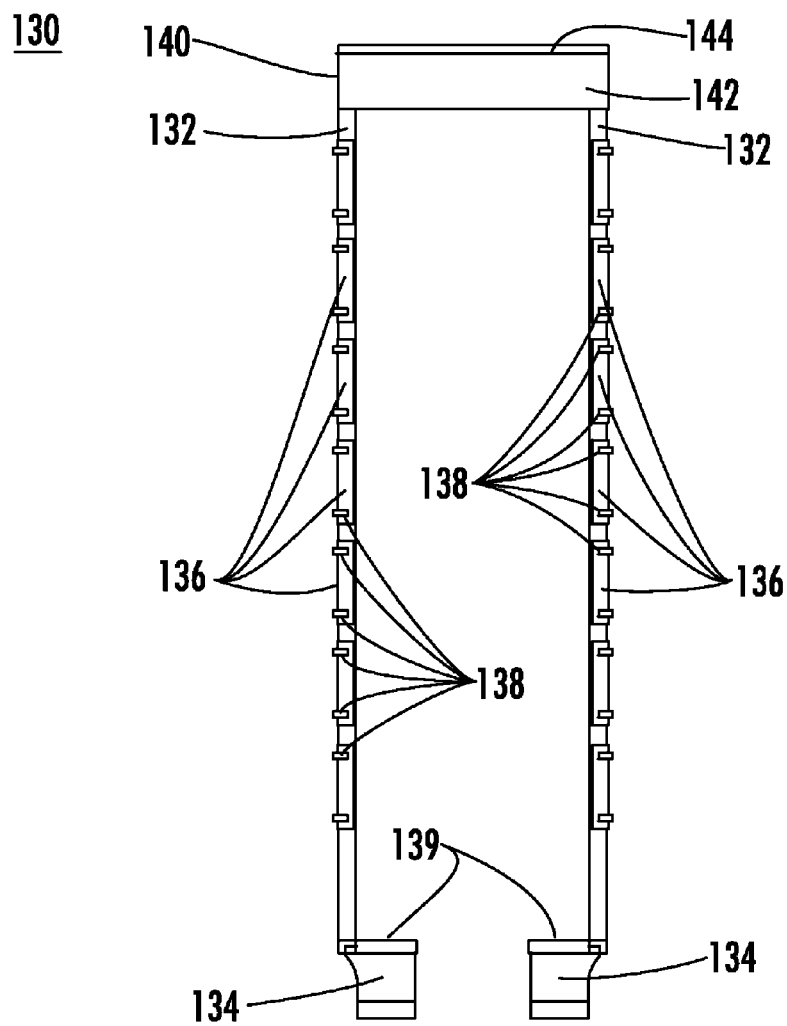
FIG. 3A is a front elevational view of the internal air duct of FIG. 2.
Figure 3B:
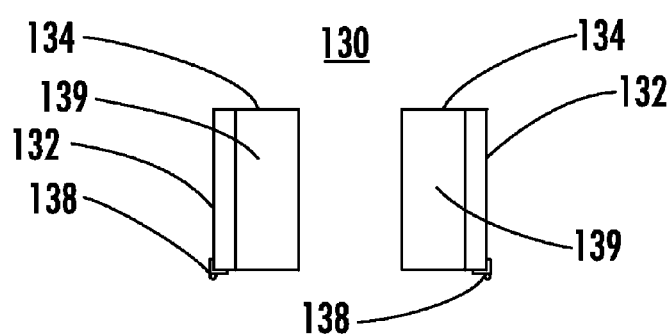
FIG. 3B is a top plan view of the internal air duct of FIG. 2.

FIGS. 3A and 3B are a front elevational view and a top plan view, respectively, of the internal air duct 130 of FIG. 2. The internal air duct 130 includes a pair of risers 132, each riser 132 extending vertically from a respective collector 134, and the two risers 132 being connected at their upper ends by an air dam 140. Each riser 132 is of generally hollow, rectangular construction, with a solid top end and a bottom end that opens into a corresponding collector 134, and includes a plurality of distribution openings or ports 135, best shown in FIG. 4, arranged along the front thereof. As perhaps best shown in FIG. 3B, the shape of each riser 132, when viewed from its end, is preferably that of a relatively long and narrow rectangle, with the width of the rectangle selected to be as close as possible to a particular dimension, defined by the enclosure 20, in order to maximize the utility of the duct 130. Similarly, though perhaps not quite as important, the length of the rectangle is preferably selected to be long, relative to the width, but limited according to the space available in the enclosure 20, also in order to maximize the utility of the duct 130.

Each collector 134 comprises a rectangular, hollow body, open to the bottom and adapted to be in fluid communication with a corresponding opening in the floor tiles 14, 16. Each collector further includes a top panel 139, shown in FIGS. 3A and 3B, but is open along one edge and adapted to be in fluid communication with the bottom of the corresponding riser 132. The collectors 134 and risers 132 are preferably constructed from sheet metal, but other materials and forms of constructions are likewise available without departing from the scope of the present invention.

Figure 4:
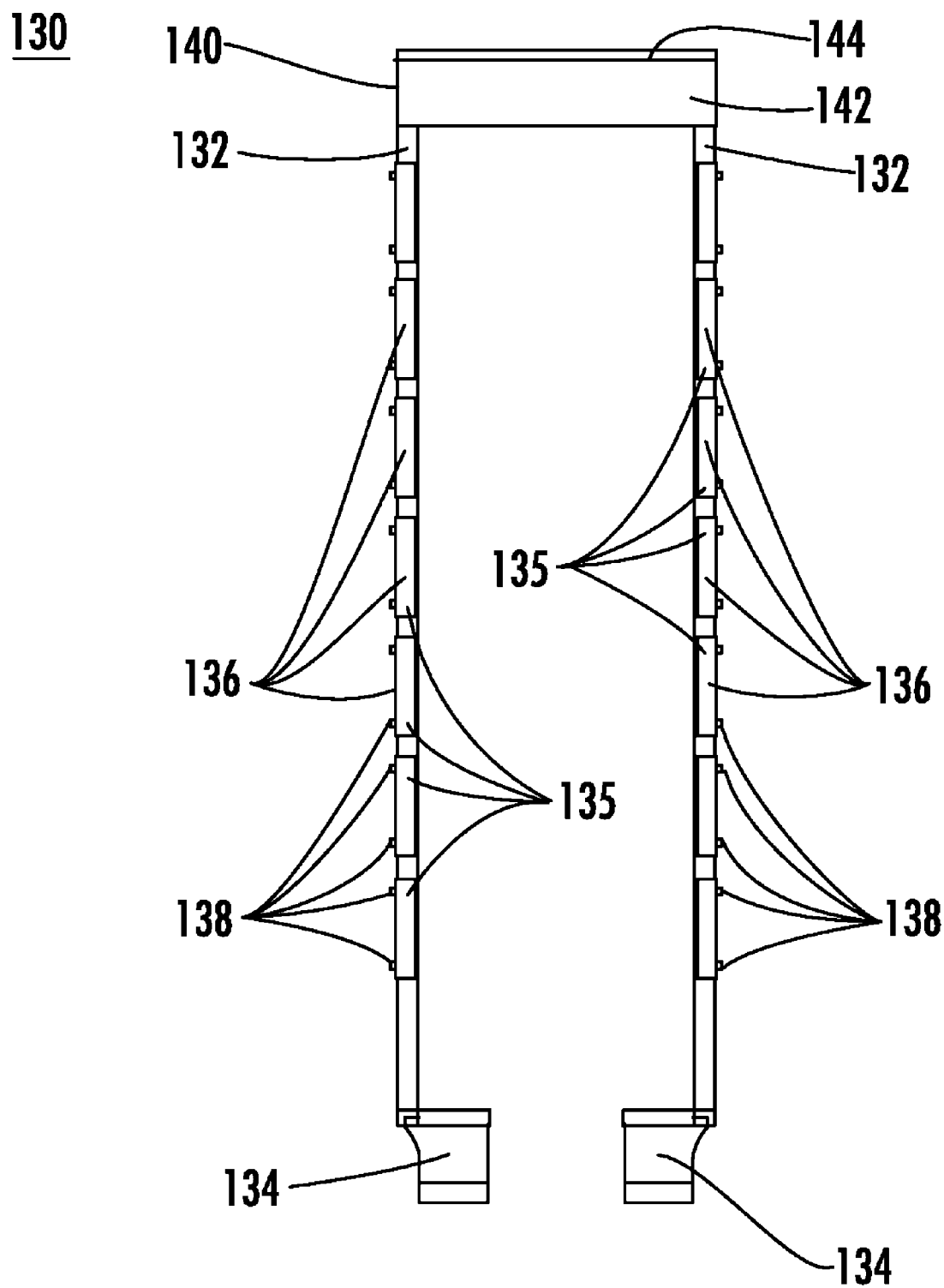
FIG. 4 is a front elevational view of the same air duct, showing adjustable doors in their open state.

In the anticipated commercial embodiment, each port 135 may be selectively closed and opened, or covered and uncovered, by a respective port door 136 mounted to one of the risers 132 by a pair of hinges 138. The hinges 138 permit each door 136 to be opened and closed individually. The selection of materials, design and construction of the doors 136 and hinges 138 will be apparent to one of ordinary skill in the art. As will be discussed hereinbelow, such doors 136 may not always be present, and even if present may be arranged in a variety of ways, all of which will be understood to be within the scope of the present invention. In FIGS. 3A and 3B, each door 136 is illustrated in its closed state. FIG. 4, on the other hand, is a front elevational view of the same internal air duct 130 showing each door 136 in its open state. The operation and use of these doors 136 will be made apparent hereinbelow.

Notably, the number of ports 135 or corresponding doors 136 is not critical to the present invention. It is preferred that a plurality of doors 136 be present in each riser, and as will be apparent from the teachings hereinbelow, the more doors 136 that are provided, the greater flexibility a user has in controlling how they are used. Nonetheless, there is also an advantage in having larger ports or openings 135 to help maximize airflow 118 therethrough, and the increase in flexibility becomes much more incremental when there are more than six to eight doors in each riser 132.

Furthermore, it will be evident that significant benefit may be gained from an implementation of the internal air duct (not shown) of the present invention in which only a single riser 132, located on one side or the other, is utilized. However, given that each enclosure 20 is typically symmetric in nature and thus has similar space available for a riser 132 on each side thereof, and given that the airflow 118 generated from one riser 132 may be decidedly less uniform than that generated from symmetrically opposed risers 132 as shown in the various embodiments of the present invention, it is preferred that two risers 132 be used whenever possible. In addition, having two risers 132 aids in preventing recirculation, because air is prevented from recirculating around both sides of the enclosure.

Figure 5:
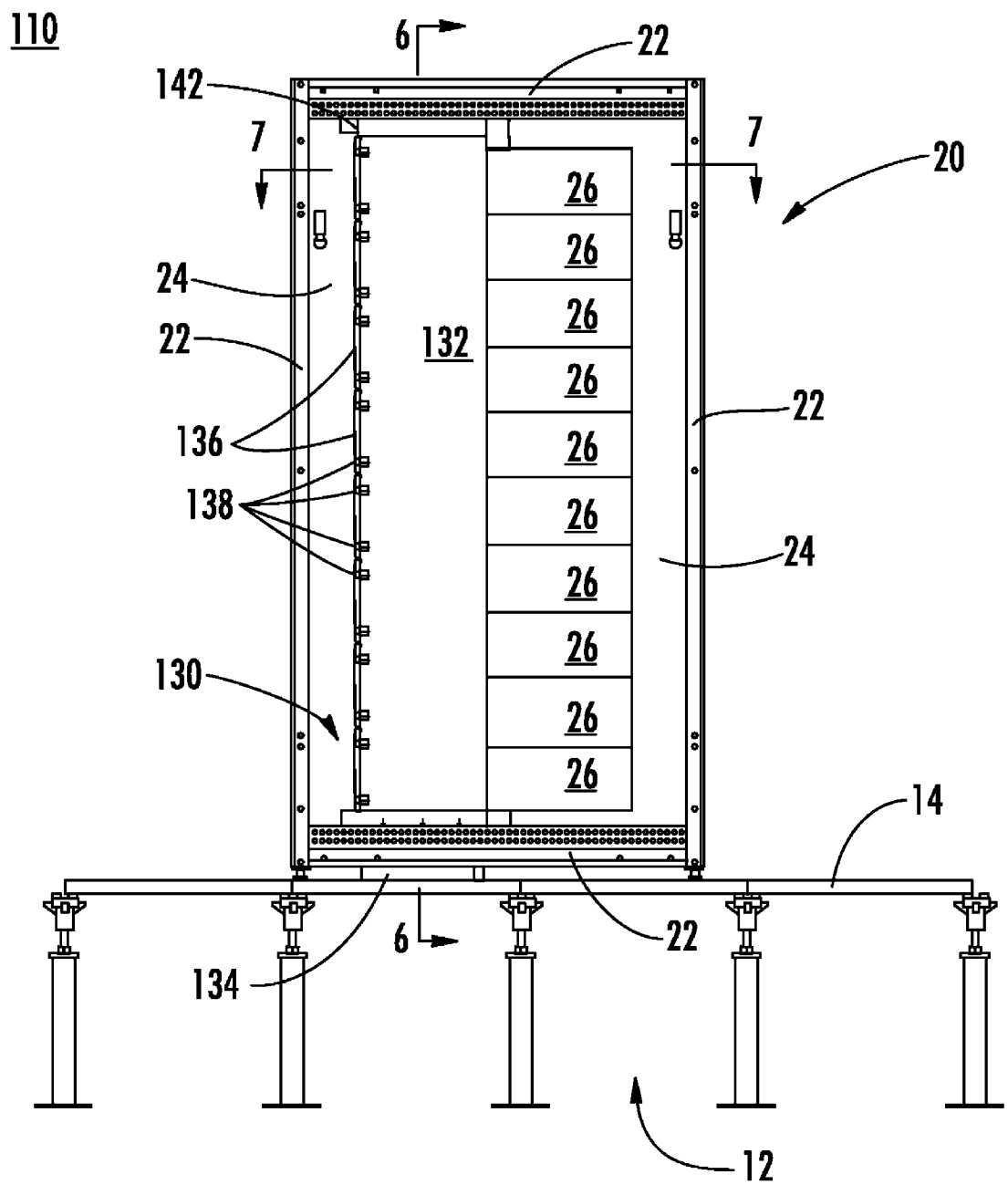
FIG. 5 is a right side elevational view of the electronic equipment enclosure installation of FIG. 2.
Figure 6:
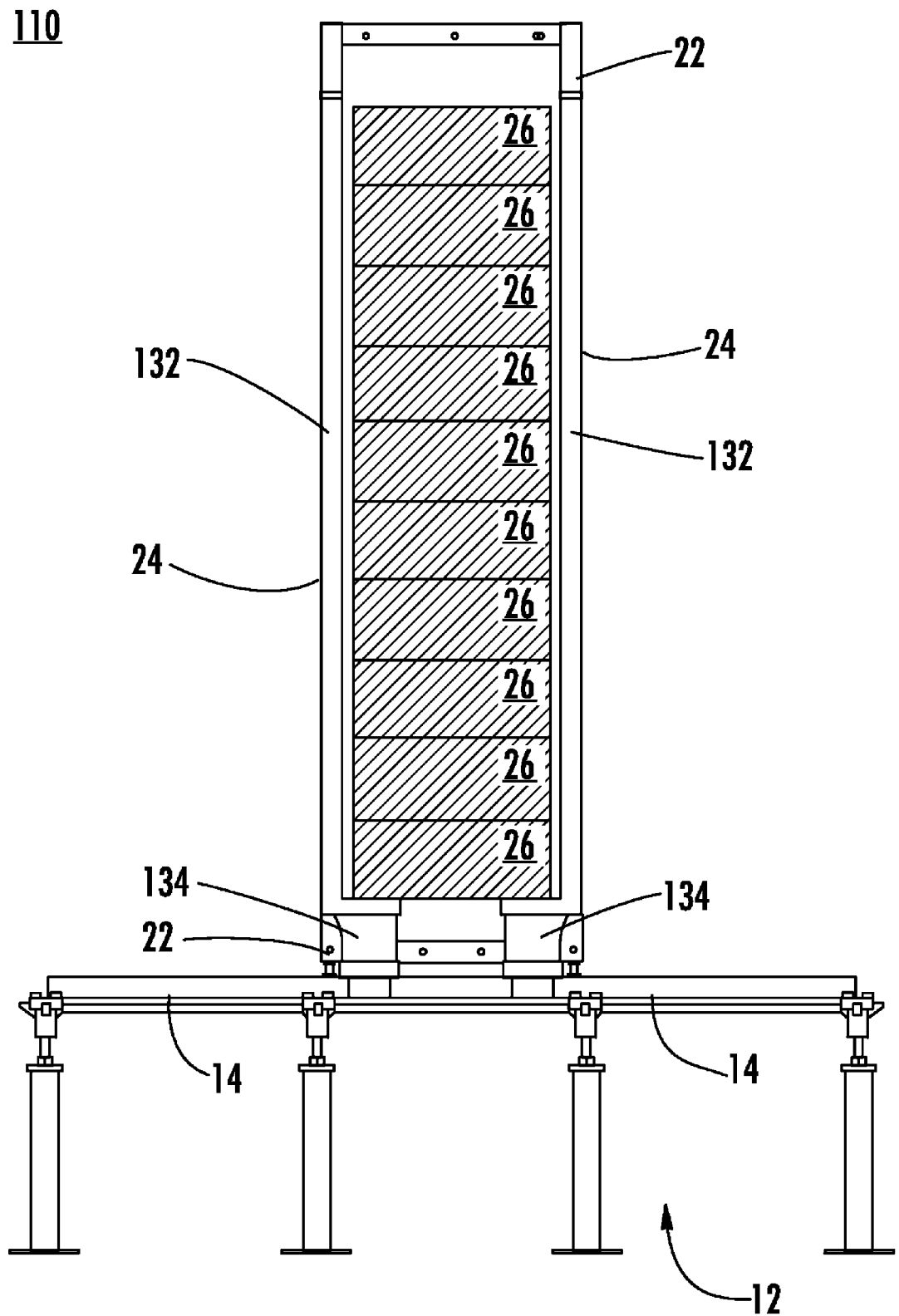
FIG. 6 is a front cross-sectional view of the electronic equipment enclosure installation of FIG. 5, taken along line 6-6.
Figure 7:
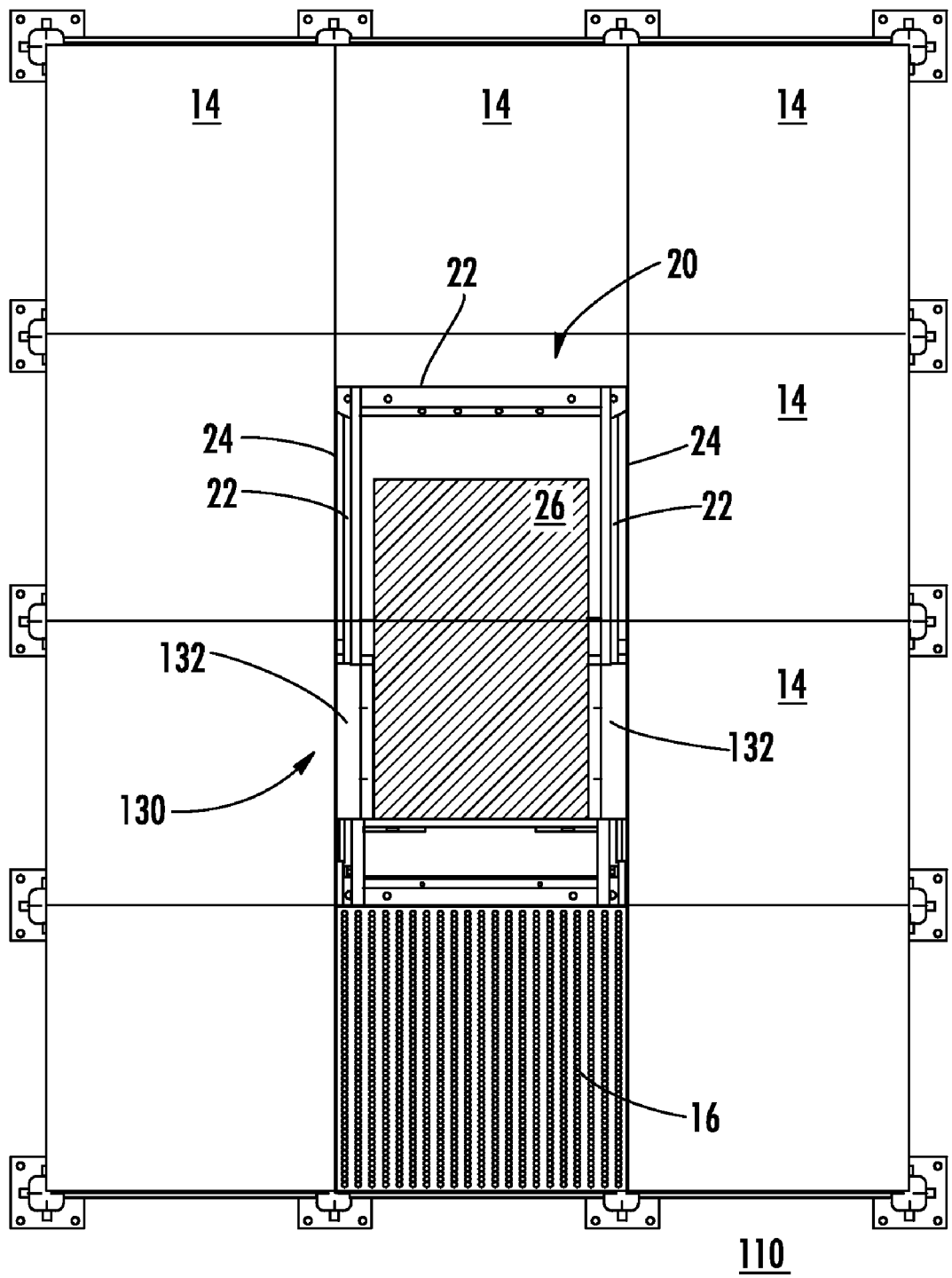
FIG. 7 is a top cross-sectional view of the electronic equipment enclosure installation of FIG. 5, taken along line 7-7.

FIG. 5 is a right side elevational view of the electronic equipment enclosure installation 110 of FIG. 2, while FIG. 6 is a front cross-sectional view of the electronic equipment enclosure installation 110 of FIG. 5, taken along line 6-6, and FIG. 7 is a top cross-sectional view of the electronic equipment enclosure installation 110 of FIG. 5, taken along line 7-7. As collectively illustrated therein, the internal air duct 130 is installed toward the front of the enclosure 20 in such a way that the risers 132 are disposed on the outside of the equipment 26 mounted in the enclosure 20. This location allows the risers 132 to take advantage of space that otherwise often goes unused in conventional enclosure installations 10. More particularly, equipment 26 is often conventionally mounted on vertical mounting rails, sometimes involving the use of horizontal mounting rails as well, that are, in turn, supported by and mounted on the frame 22 of the enclosure 20. For ease of construction, use, and the like, as well as to make available a quantity of space for routing cables within the enclosure 20, this design often results in the creation of space between the outside of the internal mounting rails and the inside of the side panels 24. The design and disposition of the risers 132 takes advantage of this arrangement, as perhaps best seen through an examination of FIG. 2 together with FIG. 7. Importantly, this allows a duct 130 of the present invention to be added to enclosures 20, both new and preexisting, without changing the dimensions of the enclosures in any way. Advantageously, the duct 130 of the present invention may thus be marketed as an accessory to both newly purchased enclosures 20 as well as those enclosures 20 already owned by a given customer.

In most implementations, it is anticipated that installation of the risers 132 and collectors 134 both will generally be easier if carried out prior to mounting the equipment 26 in the enclosure 20; however, in at least some applications, and depending upon the equipment 26 involved, it may be possible to maneuver the components of the duct 130 into position after installation of equipment 26, particularly if the side panels 24 are removed and the installer has access to the sides of the enclosure 20.

As shown, for example, in FIGS. 3A and 5, the upper air dam 140 includes two planar members 142, 144 connected at a right angle along their longer edges and disposed at the top of the risers 132. Mounting may be by any suitable means and will be evident to the Ordinary Artisan. The shape of the two planar members is not particularly important as long as they fill the space above the equipment 26, as described more fully hereinbelow. The planar members 142, 144 are preferably constructed from sheet metal, but other materials and forms of constructions are likewise available without departing from the scope of the present invention.

Figure 8:
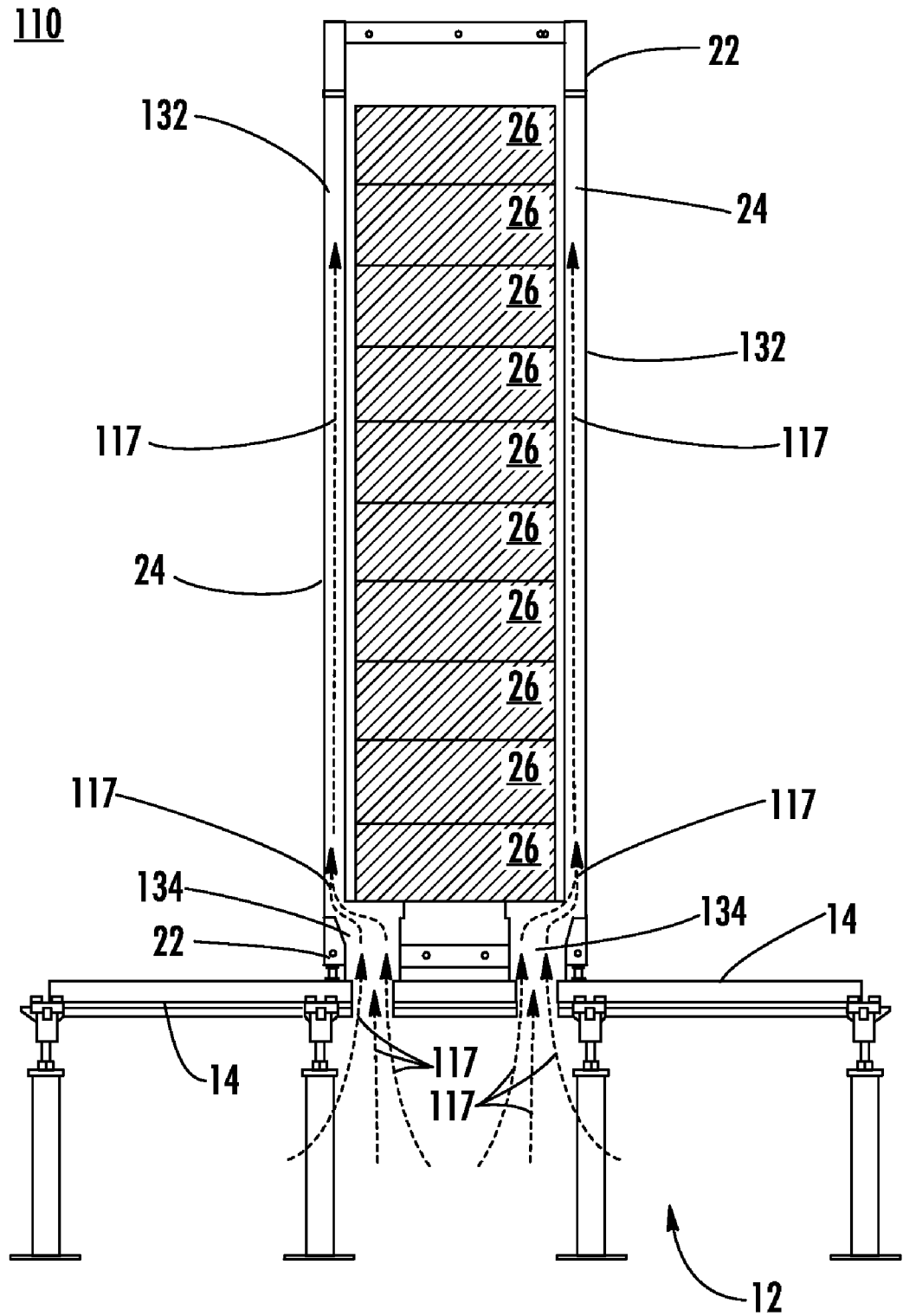
FIG. 8 is a partially schematic front cross-sectional view, similar to FIG. 6, showing the flow of air through the internal air duct.
Figure 9:
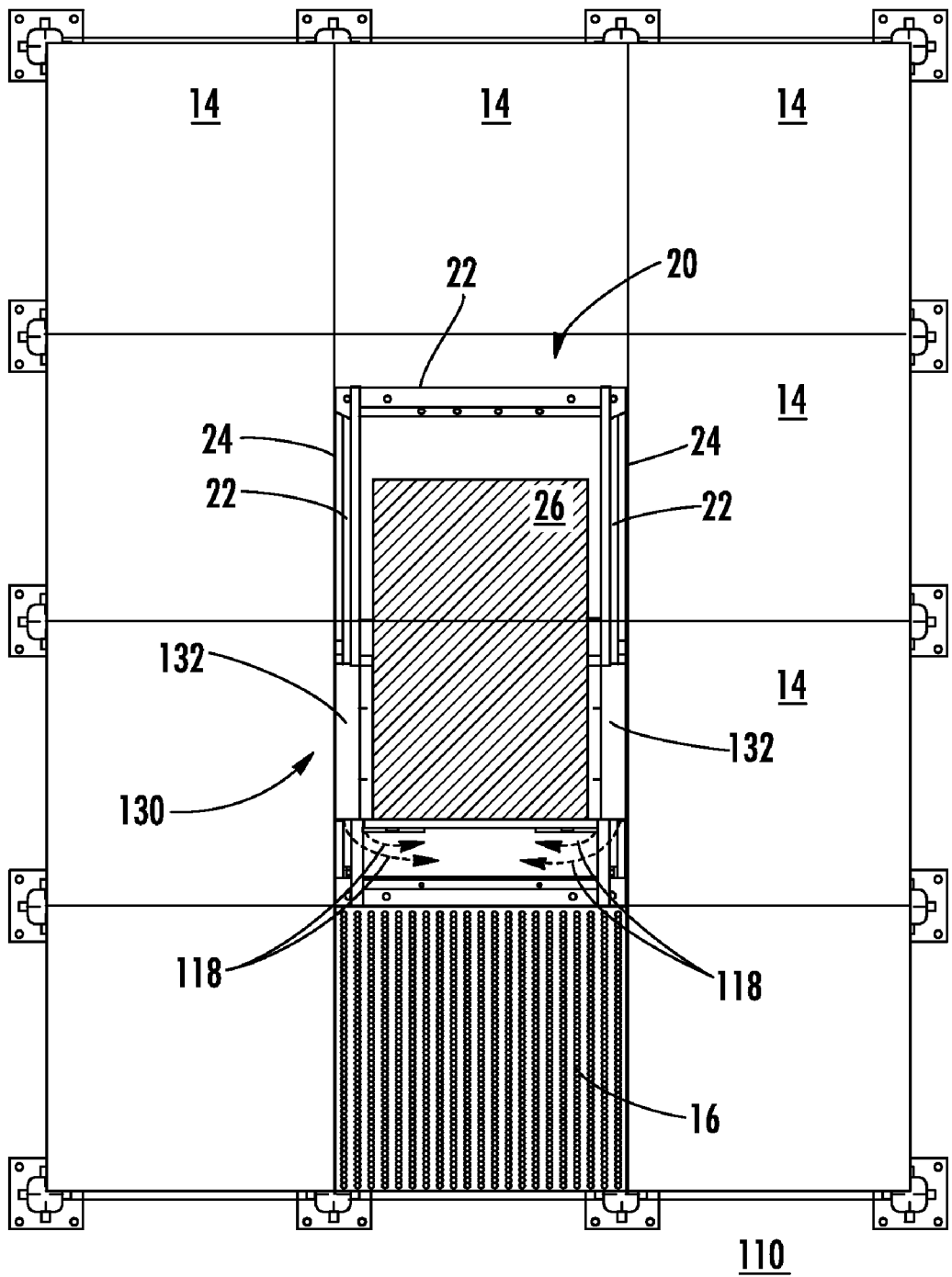
FIG. 9 is a top cross-sectional view, similar to FIG. 7, showing the flow of air from the internal air duct to the front of the electronic equipment.
Figure 10:
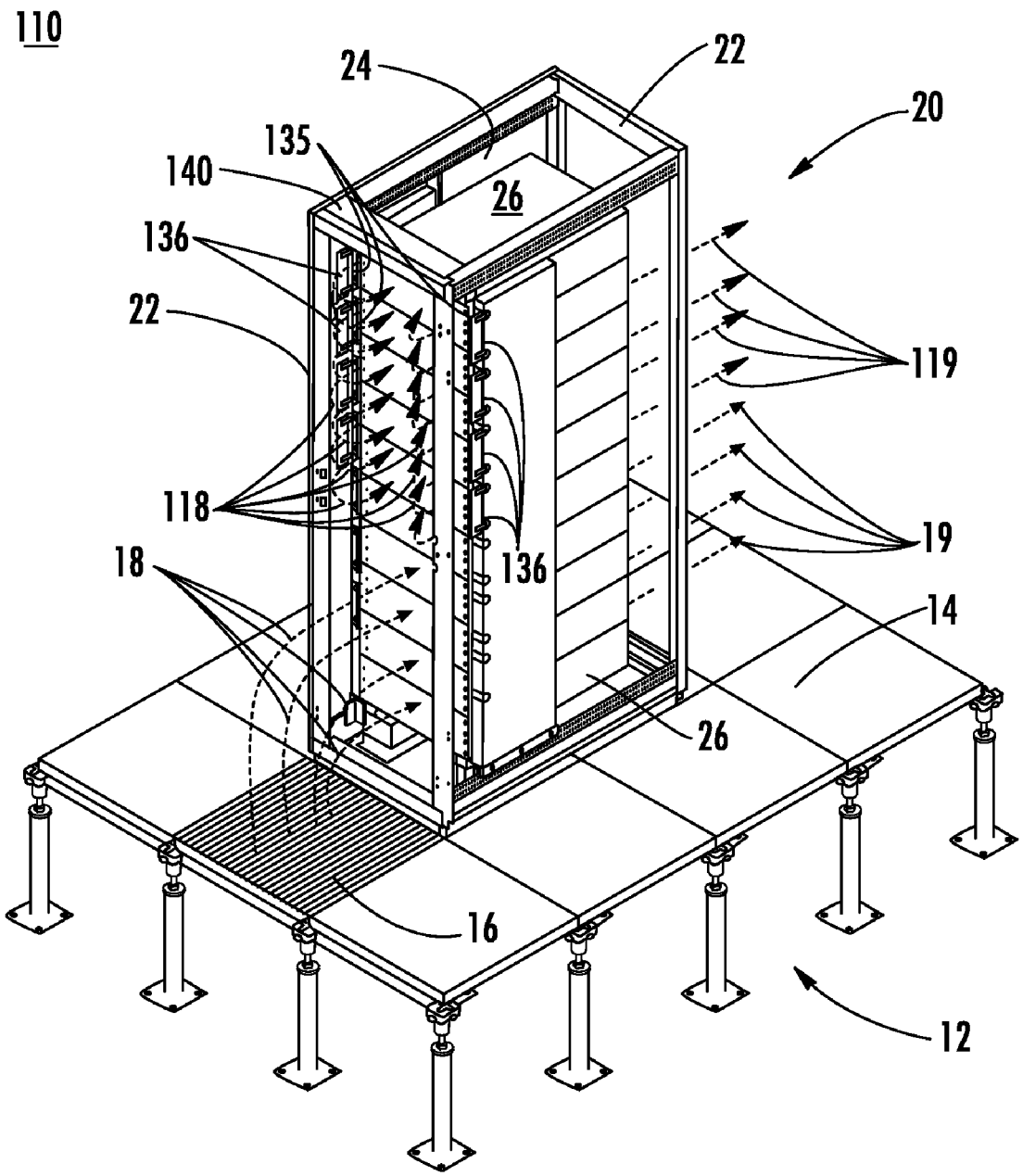
FIG. 10 is an isometric view, similar to FIG. 2, showing the flow of air from the internal air duct through the electronic equipment.

FIG. 8 is a partially schematic front cross-sectional view, similar to FIG. 6, showing the flow of air through the internal air duct 130, while FIG. 9 is a top cross-sectional view, similar to FIG. 7, showing the flow of air from the internal air duct 130 to the front of the electronic equipment 26, and FIG. 10 is an isometric view, similar to FIG. 2, showing the flow of air from the internal air duct 130 through the electronic equipment 26. Together, FIGS. 8-10 illustrate the flow of cool air from beneath the raised floor 12 through the enclosure 20 and out the rear of the enclosure 20 and how it differs from the flow of air through prior art installations 10, as shown in FIG. 1.

More particularly, as shown in FIG. 8, cool air first flows (designated by dashed arrows 117) from beneath the surface of the raised floor 12 through openings in the floor 12, such as gaps between floor tiles 14 and openings through the ventilated tiles 16, and into the collectors 134. As with prior art installations, the cool air is supplied by the CRAC (not shown). Depending upon the preferences of the user, it may be preferable to further prevent air from otherwise flowing into the bottom of the enclosure 20, but such an implementation is not strictly necessary. Furthermore, as the air flows into the collectors 134, it is then routed up through the tops of the collectors 134 where it enters the risers 132 and flows toward the tops thereof due to static pressure in the raised floor developed by the normal operation of the CRAC and any active devices, such as fans and the like, that may be present in the equipment 26 or the structure of the enclosure 20.

As shown in FIG. 9, the cool air next flows (designated by dashed arrows 118) out the front of the risers 132 and into the front portion of the enclosure 20. In FIG. 9, it is assumed that one or more ports 135 (perhaps best shown in FIG. 4) remain unblocked, thus permitting such air flow out of the risers 132 and into the interior of the enclosure 20 itself. In this way, the air reaches the front of the equipment 26. Furthermore, the body of each riser 132 blocks the air from flowing around past the side of the equipment 26 without being forced through the equipment 26. In this regard, although some cooling effect may be achieved by routing cool air past a piece of equipment 26, it is generally more effective to route as much of the cool air through the equipment 26 as possible. To this end, one purpose in maximizing the width of each riser 132 is to fill the space between the distal sides of the equipment 26 and the proximal surfaces of the side panels 24. Also to this end, the upper air dam 140 is preferably dimensioned to fill the gap between the top of the uppermost equipment 26 and the underside of the top panel (not shown), or between the top of the uppermost equipment 26 and the top front member of the frame 22, as shown in FIG. 10. In a preferred commercial embodiment, such an air dam 140 may be offered as a feature of the internal air duct 130, but alternatively, the air dam 140 could be offered as a separate accessory.

The flow 118 of cool air from the ports 135 and around to the front of the equipment 26 is further illustrated in FIG. 10. As shown therein, the air spills through all of the ports 135 whose doors 136 are open. Notably, however, several of the doors 136 on each riser 132 in FIG. 10 are closed, thereby preventing air from flowing out of the risers 132 at these points. Of course, any combination of the doors 136 may be positioned in an open or closed state at any time, according to the cooling needs of the equipment 26 in the installation 110. For example, if more equipment 26 is located near the bottom of the enclosure 20 than the top, then the user may choose to open lower doors 136 and close upper doors 136. On the other hand, in the exemplary installation 110 shown in FIG. 10, equipment 26 is distributed evenly throughout the enclosure 20. In this situation, positioning many of the upper doors 136 in their open state and positioning the lower doors 136 in their closed state may be particularly beneficial. This is because the lower equipment 26 tends to receive cool air flow 18 directly from beneath the surface of the raised floor 12, or through the front of the enclosure 20 via an open front door or panel or via vents or other openings, including those equipped with fans (not shown). In fact, because of this phenomenon, it is anticipated that the most likely area to be benefited by the internal air duct 130 of the present invention is, in fact, the upper elevations of the enclosure 20. For this reason, one preferred embodiment, and particularly the preferred commercial embodiment, of the duct (not shown) includes doors 136 only at the upper elevations of the risers 132.

Finally, as shown in FIG. 10, the air flow 118 emanating from the risers 132 passes through the generally upper elevations of the enclosure 20 from front to rear. At least some of the air flow 118 preferably passes through the equipment 26 itself, and emerges from the rear as shown by the dashed arrows 119. At the same time, the air flow 18 from the ventilated tiles 16, and/or from directly beneath the enclosure 20, passes through the generally lower elevations of the enclosure 20 from front to rear and emerges from the rear as shown by the dashed arrows 19. Of course, the air flow 19, 119 may only pass through the rear of the enclosure 20 if the rear door (not shown) is open, or if otherwise permitted by vents, openings, or other outlets, including those equipped with fans (not shown). Of course, heated air may also be guided up through outlets in the top of the enclosure 20. All of these techniques and devices are well known to the Ordinary Artisan.

As is described above in reference to FIG. 10, it is important to note that the use of the internal air duct 130 to route air to various locations within the enclosure 20 does not preclude the more traditional use of air flow 18 from ventilated tiles 16, which typically enters the front of the enclosure 20, to aid in cooling electrical equipment within the enclosure 20. Rather, the internal air duct 130 may effectively be used in conjunction with such traditional cooling techniques to provide a complete cooling system for the enclosure 20.

The hinged doors 136 of the illustrated embodiment serve at least one other important purpose, described next. It is generally preferable to force the air from the riser ports 135 around toward the front of the equipment 26 as efficiently as possible. Partly for this purpose, the doors 136 are preferably hinged along their distal edges, thereby allowing the doors 136 to be opened in such a way as to avoid blocking the flow of air 118 from reaching the equipment 26 as directly as possible. Moreover, by opening the doors 136 only partway (not shown), for example at an angle of approximately 45 degrees relative to the front surfaces of the risers 132, the doors themselves can serve as a kind of air dam by redirecting the flow of air 118 more effectively toward the center of the front portion of the enclosure interior.

A similar function may be effected by other means, such as a static air dam or air scoop that is fixed in the front interior corners of the enclosure 20 and is angled to redirect the air flow 118 toward the center of the front portion of the enclosure interior. Such a device may be flat or curvilinear, with the former perhaps being better adapted to create turbulent air flow and the latter perhaps being better adapted to create laminar air flow. Such an air dam or scoop may be mounted on either the air duct 130, and preferably on the risers 132 of the air duct 130, or may be mounted on the frame 22 of the enclosure, as desired. Either type of mounting arrangement may be easily designed and effected by the Ordinary Artisan. In a preferred commercial embodiment, such an air dam or scoop may be offered as a feature of the internal air duct 130, but alternatively, the air dam or scoop could be offered as a separate accessory.

Figure 11:
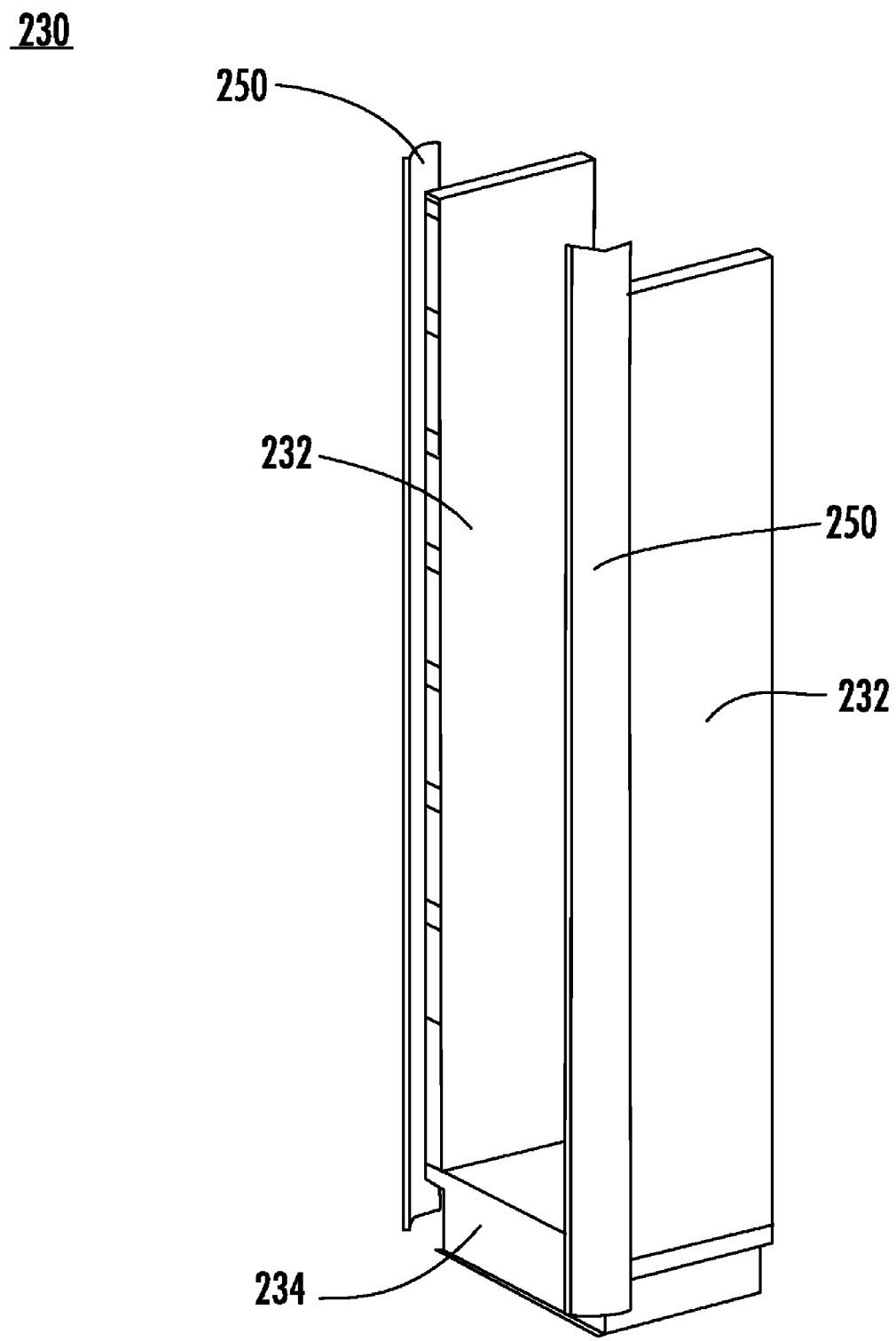
FIG. 11 is an isometric view of an alternative internal air duct in accordance with a second preferred embodiment of the present invention.

Although the general function of the aforementioned air dam or scoop, as described previously, may be accomplished to some degree by positioning the doors 136 at an acute angle, relative to the front surfaces of the risers 132, use of the air dam or scoop may be more valuable in other embodiments of the internal air duct. For example, in a variation of the internal air duct 130 shown and described hereinabove, the doors 136 and their hinges 138 may be removed altogether. This approach is generally illustrated in FIG. 11, which is an isometric view of an alternative internal air duct 230 in accordance with a second preferred embodiment of the present invention. Removing the doors may provide greater flexibility in the shape of the ports 135 and elevation at which they are disposed. With no doors to guide the flow of air 118 therefrom, the use of an air dam or scoop 250, described previously and shown generally in FIG. 11, may be particularly useful.

Figure 12:
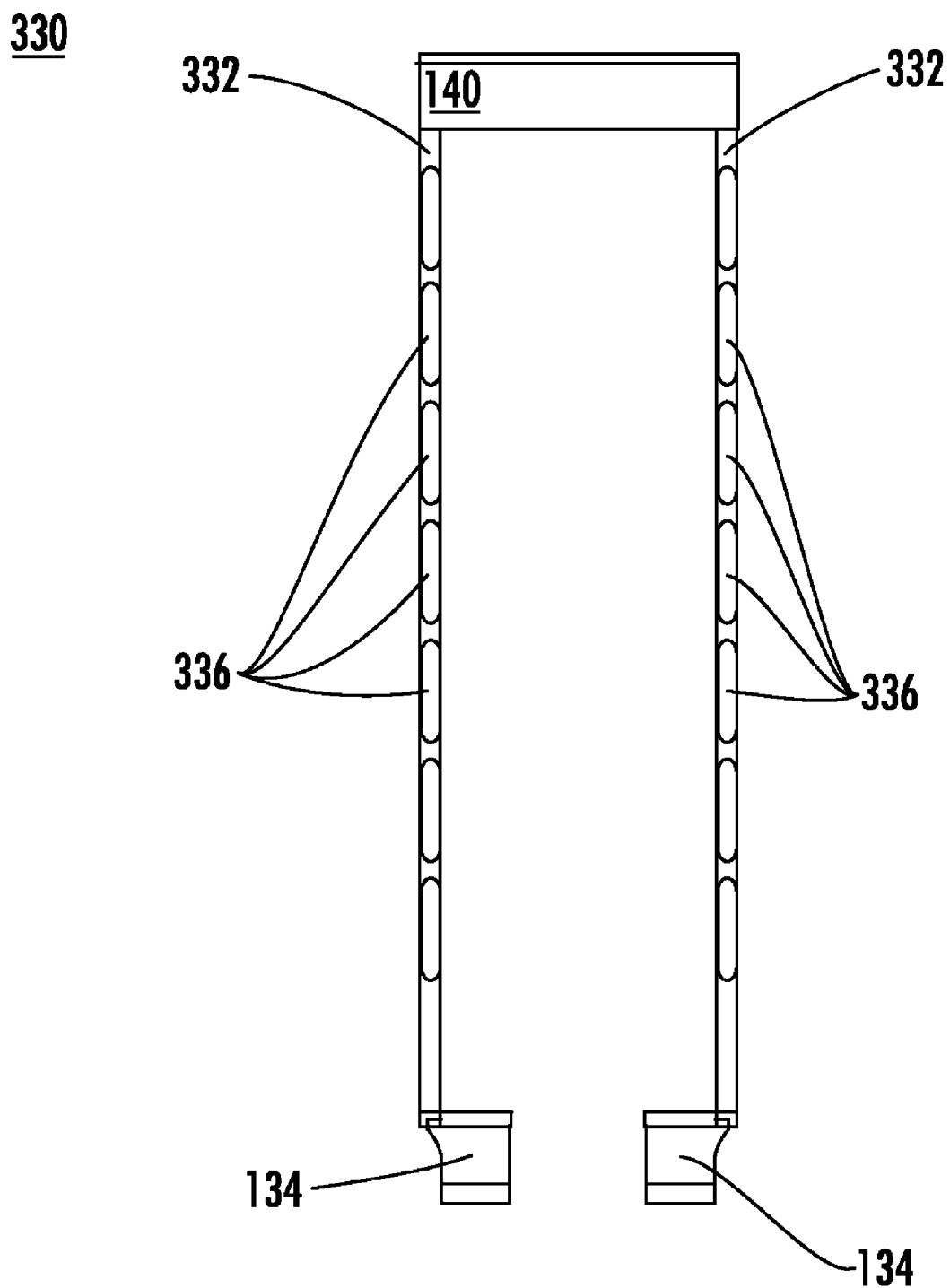
FIG. 12 is a front elevational view of an alternative internal air duct in accordance with a third preferred embodiment of the present invention.
Figure 13:
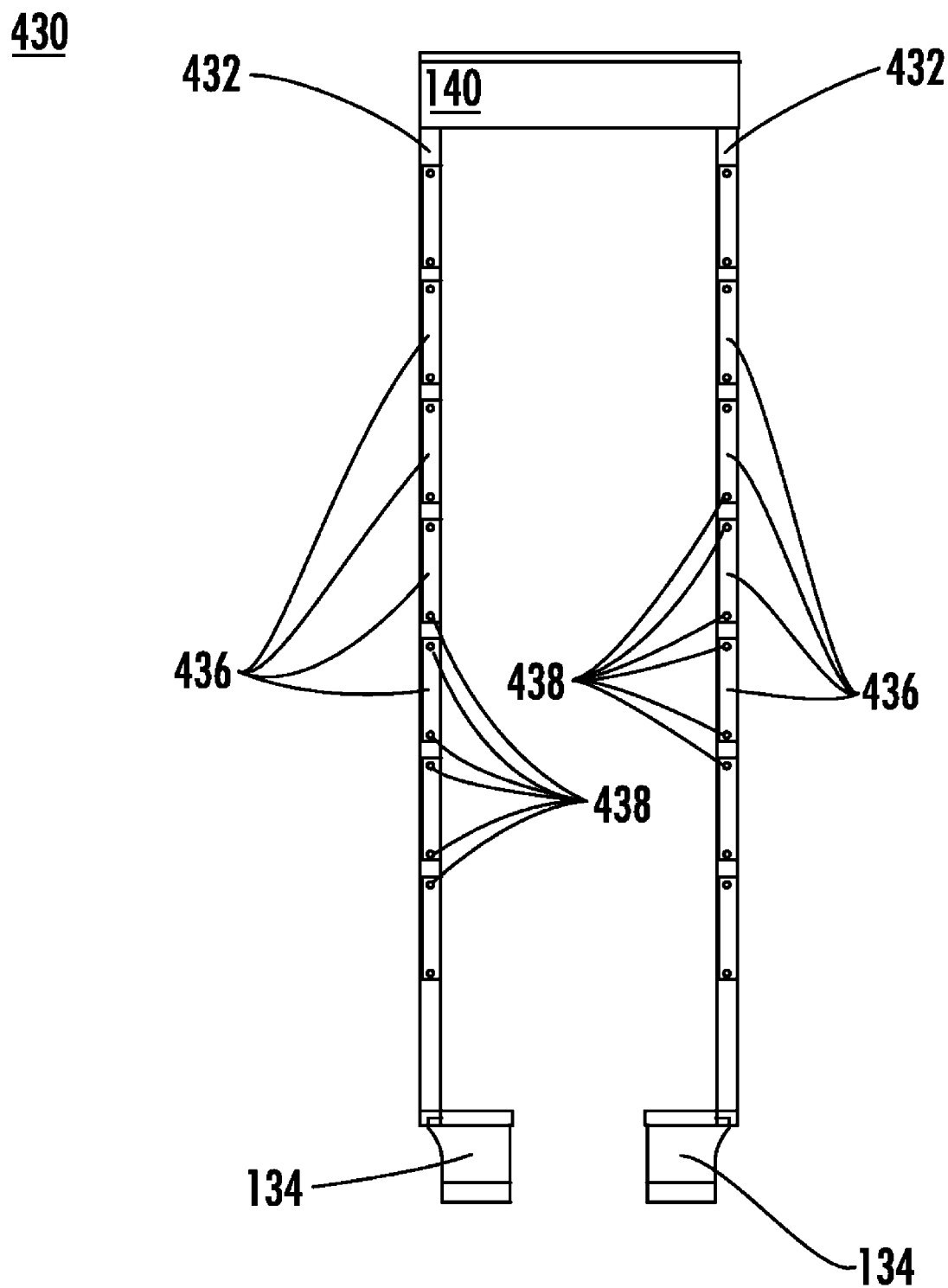
FIG. 13 is a front elevational view of another alternative internal air duct in accordance with a fourth preferred embodiment of the present invention.
Figure 14:
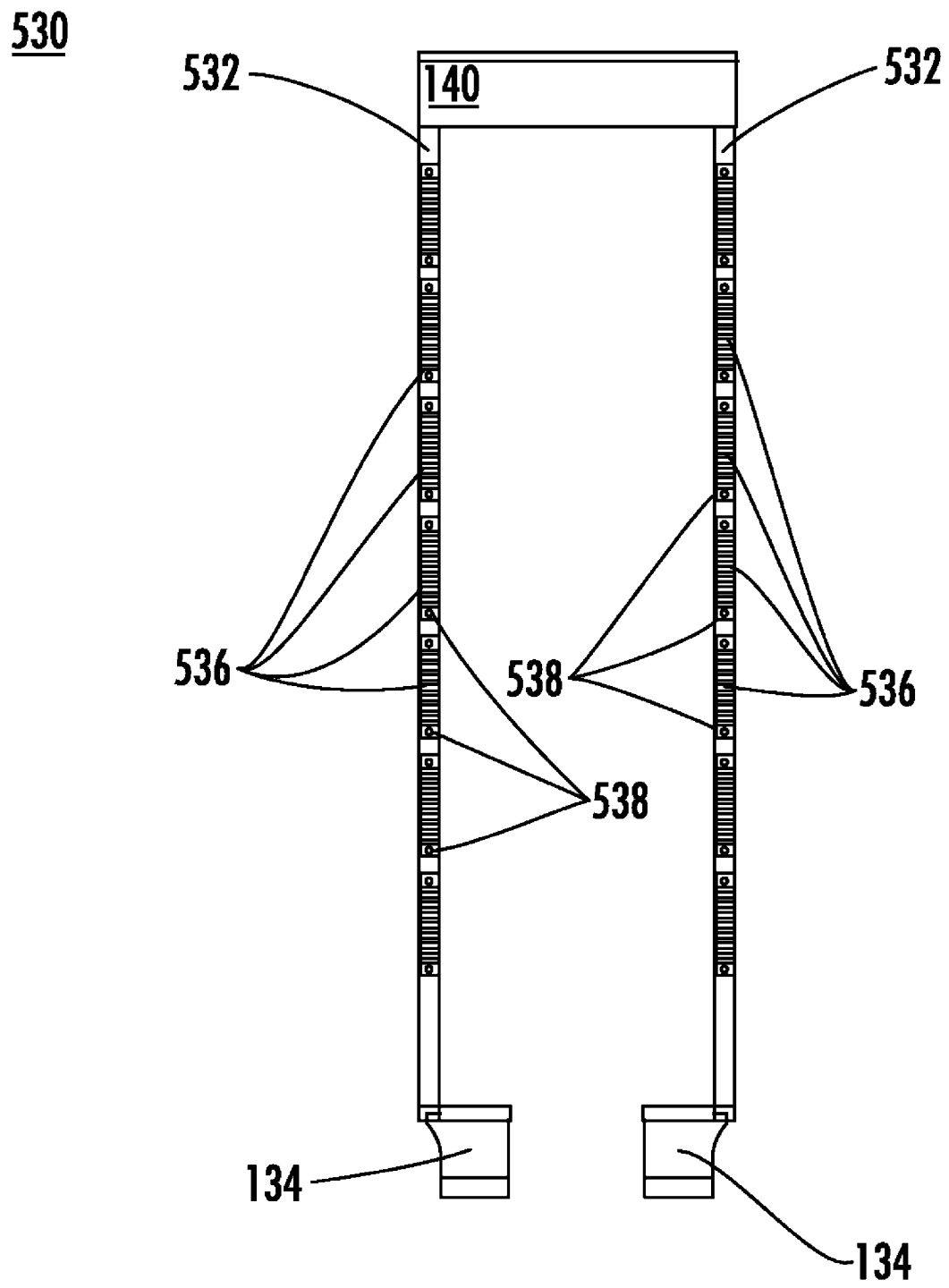
FIG. 14 is a front elevational view of another alternative internal air duct in accordance with a fifth preferred embodiment of the present invention.

Though not shown, the use of the air dam or scoop may be more valuable in other embodiments of the internal air duct as well, including but not limited to those shown in FIGS. 12-14. FIGS. 12-14 are front elevational views of alternative internal air ducts 330, 430, 530 in accordance with third, fourth and fifth preferred embodiments, respectively, of the present invention. FIG. 12, for example, illustrates an internal air duct 330 that comprises a pair of collectors 134 and a pair of risers 332 connected at their upper ends by an air dam 140, wherein each riser 332 includes a plurality of knockout panels 336 that may be removed to create permanent openings or ports in the risers 332. Such knockouts panels 336 are well known to the Ordinary Artisan. Again, unlike the ports 135 of the internal air duct 130 of FIG. 3, the ports created by the removal of the knockouts have no doors provided therefor, and thus these ports may be of any shape and may be positioned at any elevation. With no doors to guide the flow of air 118 therefrom, the use of an air dam or scoop described previously may be particularly useful for this purpose.

FIG. 13 illustrates a slightly more complex alternative air duct 430, this one comprising a pair of collectors 134 and a pair of risers 432 again connected at their upper ends by an air dam 140, wherein each riser 432 includes a plurality of openings or ports (not shown) covered by respective filler plates 436. In the arrangement shown, each filler plate 436 is attached to the front of one of the risers 432 by a pair of fasteners 438, such as thumb screws or the like, inserted therethrough and fixed to the risers 432. The advantage of the filler plates 436 relative to the knockout panels 336 is that the filler plates 436 may be removed and replaced as desired, simply by removing or restoring the fasteners 438. Again, with no doors to guide the flow of air 118 therefrom, the use of an air dam or scoop described previously may be particularly useful for this purpose. Otherwise, their use and operation is similar to that of the doors 136 of the internal air duct 130 of FIG. 3.

FIG. 14 illustrates a still more complex alternative air duct 530, this one comprising a pair of collectors 134 and a pair of risers 532 again connected at their upper ends by an air dam 140, wherein each riser 532 includes a plurality of adjustable grille assemblies 536 disposed therein. In the arrangement shown, each grille assembly 536 includes a pair of overlapping grille plates, the position of at least one of which may adjusted by manipulating a small handle 538 or the like. Again, the advantage of the grille assemblies 536 relative to the knockout panels 336 is that the grille assemblies 536 may be adjusted as desired, simply by opening or closing the overlapping grille plates. However, as with the knockout panels 336 and filler plates 436, the absence of doors to guide the flow of air 118 therefrom may make the use of an air dam or scoop described previously particularly useful for this purpose. Otherwise, their use and operation is similar to that of the doors 136 of the internal air duct 130 of FIG. 3.

Returning to FIG. 11, another alternative feature that may be incorporated into any of the various internal air ducts 130, 230, 330, 430, 530 is next described. More particularly, the internal air duct generally illustrated in FIG. 11 includes only a single collector 234, from which extend the two risers 232. There may be advantages in routing all cool air through a single collector 234, and it may also be structurally advantageous to support the risers 232 on a single collector 234. On the other hand, it may be disadvantageous to cover the entire opening beneath the enclosure 20 with the collector 234, thereby preventing or limiting cable access and perhaps other cooling effects. Nonetheless, this unified collector design, as well as other implementations of the collectors 134, shall be considered within the scope of the present invention.

An internal air duct 130, 230, 330, 430, 530 implementing the features described and illustrated herein, including the upper air dam 140, has been found to provide additional airflow of over 200 CFM at 0.1" of water (over 350 CMH at 0.02 kPa) from the plenum beneath the surface of the raised floor 12 to the upper regions of the enclosure 20, thereby reducing hot spots therein, particularly in medium and high density equipment applications. This is a significant supplement to the airflow 18 delivered to the interior of an enclosure 20 from a conventional ventilated tile 16, having 25% open area, of approximately 700 CFM. In larger cabinets, additional airflow of even greater magnitudes may be provided. For example, in some larger cabinets, an internal air duct 130, 230, 330, 430, 530 implementing the features described and illustrated herein, including the upper air dam 140, has been found to provide additional airflow of over 500 CFM, over and above the 700 CFM provided by conventional means.

In summary, the internal air duct 130, 230, 330, 430, 530 of the present invention is passive, relying generally on the air pressure differential generated by the CRAC as measured between the raised floor plenum and the ambient room. Advantageously, such a duct 130, 230, 330, 430, 530 imposes no requirements for redundancy in power, fans or filters. The burden of redundancy is at the CRAC unit itself.

Use of the internal air duct 130, 230, 330, 430, 530 can provide significant thermal energy savings. The amount of thermal energy required to cool a cabinet effectively is determined to some extent by the ability of the air distribution system to deliver cool air precisely where it is needed. Equipment manufacturers and industry standards groups, such as the American Society of Heating, Refrigerating and Air-Conditioning Engineers ("ASHRAE"), specify maximum inlet temperatures that are acceptable for data center environments. Historically, the hottest inlet air is present at the equipment air inlet that is located farthest away from a perforated raised floor tile (usually, the topmost location of the rack). In such a situation, the temperature of a single server at the top of the rack can be too high while all of the other equipment in the rack is within acceptable temperature limits.

When faced with such a situation, a datacenter manager will often lower the CRAC cold air temperature to compensate for the hottest equipment 26. This succeeds in lowering the temperature in the hotspot to necessary levels, but the temperature of cool air that is provided to the rest of the equipment 26 in the enclosure 20 is generally lower than is needed. Unfortunately, in conventional enclosures (i.e., those lacking the internal air duct of the present invention), there is no way to take advantage of this excess cooling capacity. Instead, the overly-cool air is exhausted from the enclosure (and in fact is often actually cool enough to be used again as cooling air), where it goes unused. Such an arrangement is energy inefficient, because the CRAC is forced to cool the air in the plenum to levels sufficient to cool the hottest equipment, even though most of the equipment 26 does not require such cool temperatures.

The internal air duct 130, 230, 330, 430, 530 aids in equalizing the temperature distribution of cool air that is being used to cool the equipment 26 disposed in the enclosure 20. By controlling the various ports 135 appropriately, cool air can be directed to where it is needed most. Temperatures are equalized, and the cool air can be used to greater effect (i.e., the air exhausted to the room is relatively warmer than the air that would be exhausted if the internal air duct 130, 230, 330, 430, 530 was not used). In many cases, a datacenter manager may be able to raise the temperature of the cold air delivered by the CRAC. In other words, the cooling air is used more efficiently than in conventional arrangements.

Such a process may be effected by locating conventional temperature-measuring devices at desired locations within the enclosure 20, at the enclosure outlets, or even outside the enclosure 20. Further, temperature-measuring devices may be incorporated into the equipment 26 itself. By interpreting temperature data determined by any of these devices, appropriate adjustment may be made to the various ports 135 until the various exhaust temperatures are relatively balanced. Subsequently or as part of this process, the CRAC itself may be controlled to provide cooling air, via the plenum, at a temperature that provides sufficient cooling capability at the highest possible air temperature. Other conventional balancing techniques may likewise be used to achieve balancing from one enclosure 26 to another.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A method of cooling electronic equipment mounted in an enclosure, the enclosure defining a front, two sides, and a rear, the method comprising:

routing air from directly beneath the enclosure to an upper portion of the enclosure via a riser, the riser having a front facing toward the front of the enclosure but spaced apart therefrom, wherein routing air from beneath the enclosure to an upper portion of the enclosure includes routing air from beneath the enclosure through a collector and into the riser and further routing air through the riser to a plurality of ports;

selectively routing air to electronic equipment mounted in the upper portion of the enclosure by opening or closing one or more of the plurality of ports disposed at the front of the riser and facing toward the front of the enclosure such that the air flows through the open ports toward the front of the enclosure, wherein routing air to the electronic equipment includes redirecting air flowing from the one or more ports, after it leaves such port, from a first direction of flow to a second direction of flow, the first direction of flow being substantially toward the front of the enclosure and the second direction of flow being generally toward a side of the enclosure and across a front of the electronic equipment, and wherein the plurality of ports are arranged in the upper portion of the enclosure; and exhausting heated air from the electronic equipment to an enclosure outlet.

2. The method of claim 1, further comprising configuring the collector such that an interior thereof is in fluid communication with an interior of the riser, such that air may flow freely from the beneath the enclosure through the collector to the riser.

3. The method of claim 1, wherein the step of redirecting the air flowing from the one or more ports is carried out by a hinged door.

4. The method of claim 3, wherein the step of opening or closing the one or more ports is also carried out by the hinged door.

5. The method of claim 1, wherein the step of redirecting the air flowing from the one or more ports is carried out by an air dam disposed adjacent a front corner of the enclosure.

6. The method of claim 1, wherein the front of the riser is generally co-planar with a front of the electronic equipment.

* * * * *